United States Patent
Wu

(10) Patent No.: US 11,616,001 B1
(45) Date of Patent: Mar. 28, 2023

(54) DISSIPATION OF HEAT FROM A SEMICONDUCTOR CHIP

(71) Applicant: Innostar Service, Inc., Taichung (TW)

(72) Inventor: Chih-Meng Wu, Taichung (TW)

(73) Assignee: Innostar Service, Inc., Taichung (TW)

( * ) Notice: Subject to any disclaimer, the term of this patent is extended or adjusted under 35 U.S.C. 154(b) by 30 days.

(21) Appl. No.: 17/482,347

(22) Filed: Sep. 22, 2021

(51) Int. Cl.
| | |
|---|---|
| *H01L 23/473* | (2006.01) |
| *H01L 25/065* | (2006.01) |
| *H01L 23/31* | (2006.01) |
| *H01L 23/40* | (2006.01) |

(52) U.S. Cl.
CPC .......... *H01L 23/473* (2013.01); *H01L 23/31* (2013.01); *H01L 25/0657* (2013.01); *H01L 2023/4068* (2013.01)

(58) Field of Classification Search
CPC ... H01L 23/473; H01L 23/31; H01L 25/0657; H01L 2023/4068
See application file for complete search history.

(56) References Cited

U.S. PATENT DOCUMENTS

| | | |
|---|---|---|
| 7,002,247 B2 | 2/2006 | Mok et al. |
| 2019/0393193 A1 | 12/2019 | Eid et al. |
| 2020/0006194 A1* | 1/2020 | Huang ................ H01L 25/0657 |
| 2020/0105644 A1 | 4/2020 | Teng et al. |
| 2020/0111728 A1 | 4/2020 | Chen et al. |
| 2021/0407887 A1* | 12/2021 | Yu ........................ H01L 23/46 |

* cited by examiner

*Primary Examiner* — Timor Karimy
(74) *Attorney, Agent, or Firm* — Bruce Stone LLP; Joseph A. Bruce

(57) ABSTRACT

A semiconductor chip includes semiconductor dice contained in a packaging apparatus including a cover and a plate, thereby forming a vapor chamber. The semiconductor dice and intermediate layers are alternately stacked. A capillary mechanism is provided on a horizontal internal face of the cover. Nets are provided on vertical internal faces of the cover, around the capillary mechanism. Each of the intermediate layers includes protuberances in contact with the nets. A channel is defined between any adjacent two of the protuberances. The channels travel past the intermediate layers. Coolant filled in the vapor chamber is turned into vapor after absorbing heat. The vapor ascends to the cover via the channels. The coolant is returned into liquid after transferring heat to the cover. The liquid descends to the plate. Thus, the coolant is circulated in the vapor chamber. Each of the intermediate layers includes a capillary structure to facilitate the circulation of the coolant.

9 Claims, 8 Drawing Sheets

DISSIPATION OF HEAT FROM A SEMICONDUCTOR CHIP

BACKGROUND OF INVENTION

1. Field of Invention

The present invention relates to a semiconductor chip and, more particularly, to dissipation of heat from a semiconductor chip.

2. Related Prior Art

A 3-dimensional semiconductor chip includes a stack of semiconductor dice to provide excellent performance in a small volume. However, in use, such a semiconductor chip produces a lot of heat that raises the temperature of the semiconductor chip and such raised temperature affects the performance of the semiconductor chip. It is important to dissipate such heat from such a semiconductor chip.

US Patent No. 20200105644, a heat-dissipating apparatus is attached to a 3-dimensional semiconductor chip. A pump is used to make cooling liquid go through a channel to carry heat away from the 3-dimensional semiconductor chip. Such a pump is however too big for such 3-dimensional semiconductor chips that are made small, particularly in a trend to make them even smaller.

Taiwanese Patent Application Publication No. 202002201 discloses an apparatus for dissipating heat from a semiconductor chip including a stack of semiconductor dices disclosed in Taiwanese Patent Application Publication No. 202121618. The heat-dissipating apparatus includes heat-dissipating made of a thermal interface material which is excellent in heat transfer. The heat-dissipating layers are alternately arranged with the semiconductor dice. The heat-dissipating layers are connected to one another by silicon vias or copper rods. However, the dissipation of heat inadequate, particularly for those semiconductor dice located in the bottom of the stack.

As disclosed in Japanese Patent No. 5554444 and Taiwanese Patent Application Publication No. 202002031 for example, semiconductor dice are located in a vapor chamber filled with coolant in the state of liquid. The vapor chamber includes a cover connected to a plate. The coolant is vaporized after absorbing heat from the semiconductor dice. The coolant is condensed after transferring the heat to the cover. Finally, the cover dissipates the heat to the environment.

Taiwanese Patent No. 1672775 discloses at least one cooling channel extending around a stack of semiconductor dice. Coolant is circulated and transformed in the cooling channel.

As disclosed in US Patent No. 20200111728 and Chinese Patent No. 111009493, a semiconductor chip includes a vapor chamber between at least one semiconductor die and a plate of a packaging layer for the semiconductor chip.

In the above-discussed vapor chambers, an intermediate layer of a thermal interface material or packaging paste is located between the vapor chamber and the semiconductor chip. The efficiency of heat transfer in the intermediate layer influences the efficiency of the dissipation of heat from the vapor chamber.

US Patent Application Publication No. 20190393193 discloses semiconductor dice alternately arranged with vapor chambers filled with coolant. However, each of the vapor chambers is very thin since it is sandwiched between two of the semiconductor dice. The coolant circulated in the vapor chambers that are very small in volume. Hence, the efficiency of dissipation of heat from the semiconductor dice via the vapor chambers is inadequate.

U.S. Pat. No. 7,002,247 discloses a semiconductor device including an interposer 102 including two plates 104 and 106. Each of the plates 104 and 106 includes a wick structure 122. The plates 104 and 106 in conjunction with a back surface 119 of a semiconductor device 108 form a vapor chamber structure filled with coolant. However, the semiconductor device is weak structurally and can easily be damaged.

The present invention is therefore intended to obviate or at least alleviate the problems encountered in the prior art.

SUMMARY OF INVENTION

It is the primary objective of the present invention to provide a semiconductor chip that is excellent in dissipation of heat.

To achieve the foregoing objective, the semiconductor chip includes multiple semiconductor dice located in a vapor chamber filled with coolant. The vapor chamber includes a plate and a cover. The cover includes at least one capillary mechanism formed on an internal face and at least one net covering the capillary mechanism. The cover is connected to the plate. The multiple semiconductor dice are inserted in the vapor chamber. Multiple intermediate layers are alternately arranged with the multiple semiconductor dice. Each of the intermediate layers includes an upper capillary mechanism, a lower capillary mechanism, multiple protuberances extending from an edge, and multiple recesses alternately arranged with the protuberances. The protuberances are in contact with the net. The recesses of the intermediate layers are in communication with one another to provide channels in communication with the vapor chamber. The coolant is circulated in the vapor chamber by the capillary mechanism of the cover, the channels and the upper and lower capillary mechanisms of the intermediate layers to transfer heat to the cover from the semiconductor dice.

Other objectives, advantages and features of the present invention will be apparent from the following description referring to the attached drawings.

BRIEF DESCRIPTION OF DRAWINGS

The present invention will be described via detailed illustration of two embodiments referring to the drawings wherein.

DETAILED DESCRIPTION OF EMBODIMENTS

Figure 1:
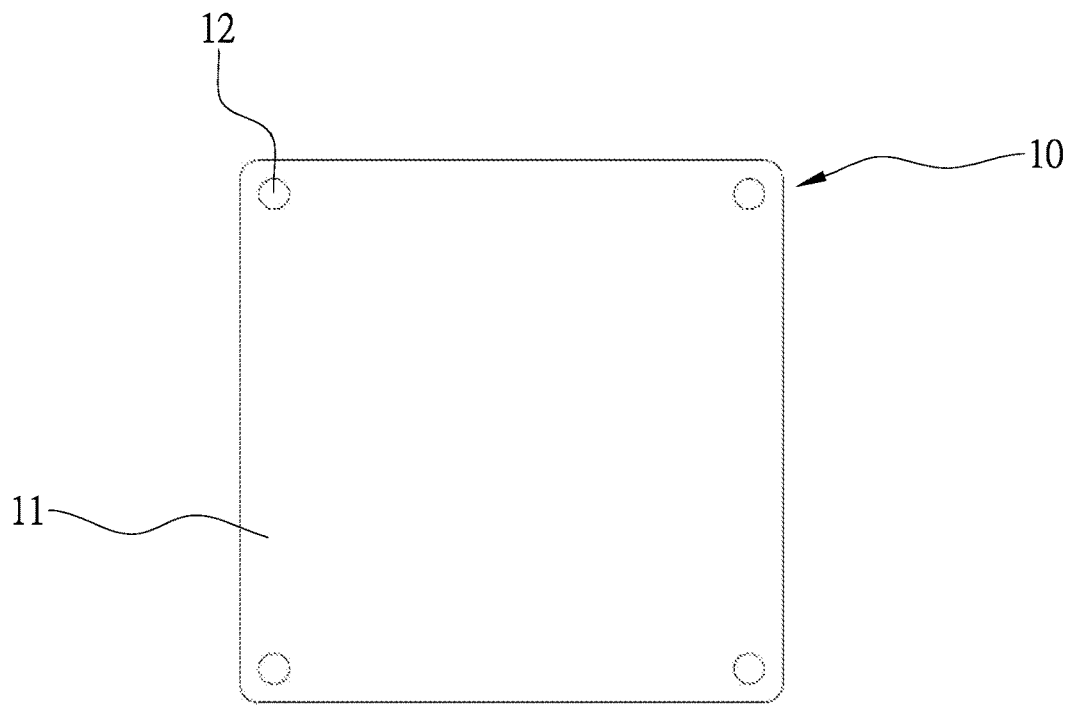
FIG. 1 is a top view of a semiconductor chip according to the first embodiment of the present invention.
Figure 2:
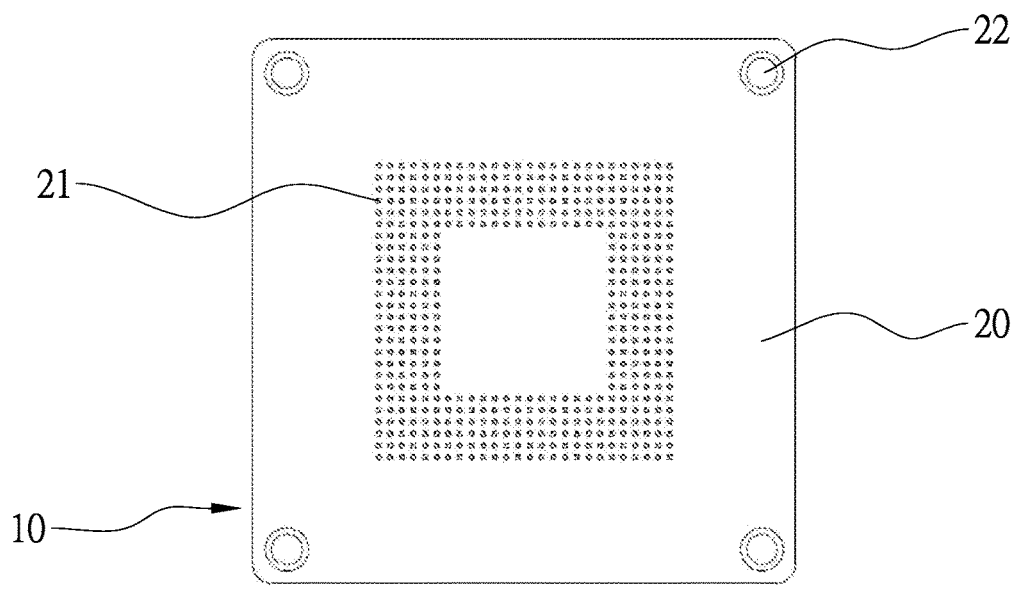
FIG. 2 is a bottom view of the semiconductor chip shown in FIG. 1.
Figure 3:
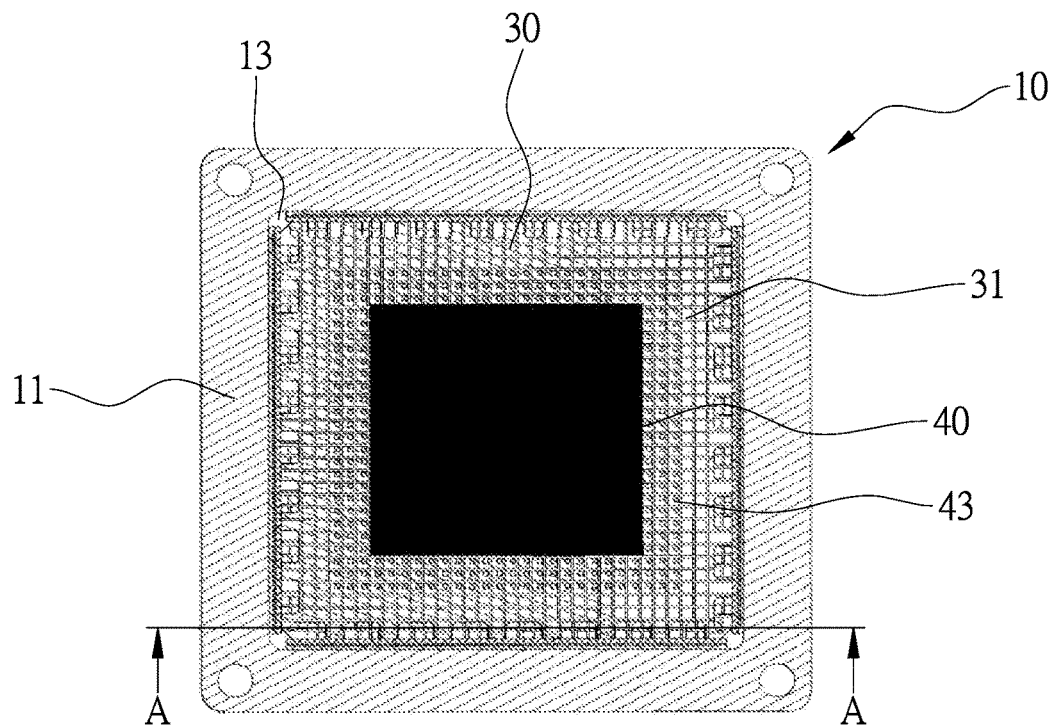
FIG. 3 is a cross-sectional view of the semiconductor chip shown in FIG. 1.

Referring to FIGS. 1 through 10 and 13, a semiconductor chip 10 includes three semiconductor dice 44, three intermediate layers 30, 32 and 33, a packing layer and a heat-dissipating device according to a first embodiment of the present invention. There are three semiconductor dice 44 alternately arranged with three intermediate layers 30, 32 and 33 for example. The packing layer encapsulates the semiconductor dice 44 and the intermediate layers 30, 32 and 33. The heat-dissipating device dissipates heat from the semiconductor dice 44 via the packaging layer.

The packing device includes a cover 11 and a plate 20. The cover 11 is a rectangular element with four corners (not numbered). Four orifices 12 are made in the cover 11. Each of the orifices 12 is located in vicinity of one of the corners of the cover 11. Preferably, the cover 11 is made of copper, copper alloy, any other proper metal or any other excellent heat-transferring material. In another embodiment, the cover 11 is made of a polymer coated with copper, copper alloy or any other proper metal.

The plate 20 is a rectangular element formed with four corners like the cover 11. Multiple pins 21 extend from a central portion of the plate 20. Four bonding pads 22 are formed on the plate 20. Each of the bonding pads 22 is located in vicinity of one of the corners of the plate 20.

Figure 4:
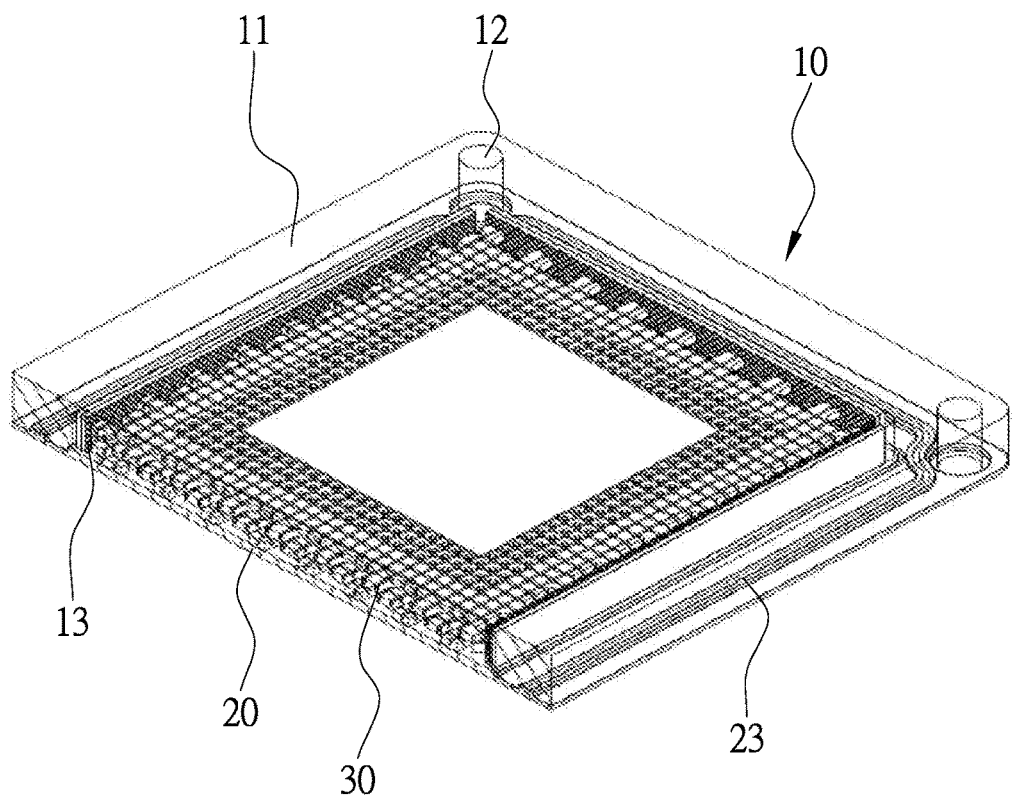
FIG. 4 is a cut-away view of the semiconductor chip shown in FIG. 1.
Figure 10:
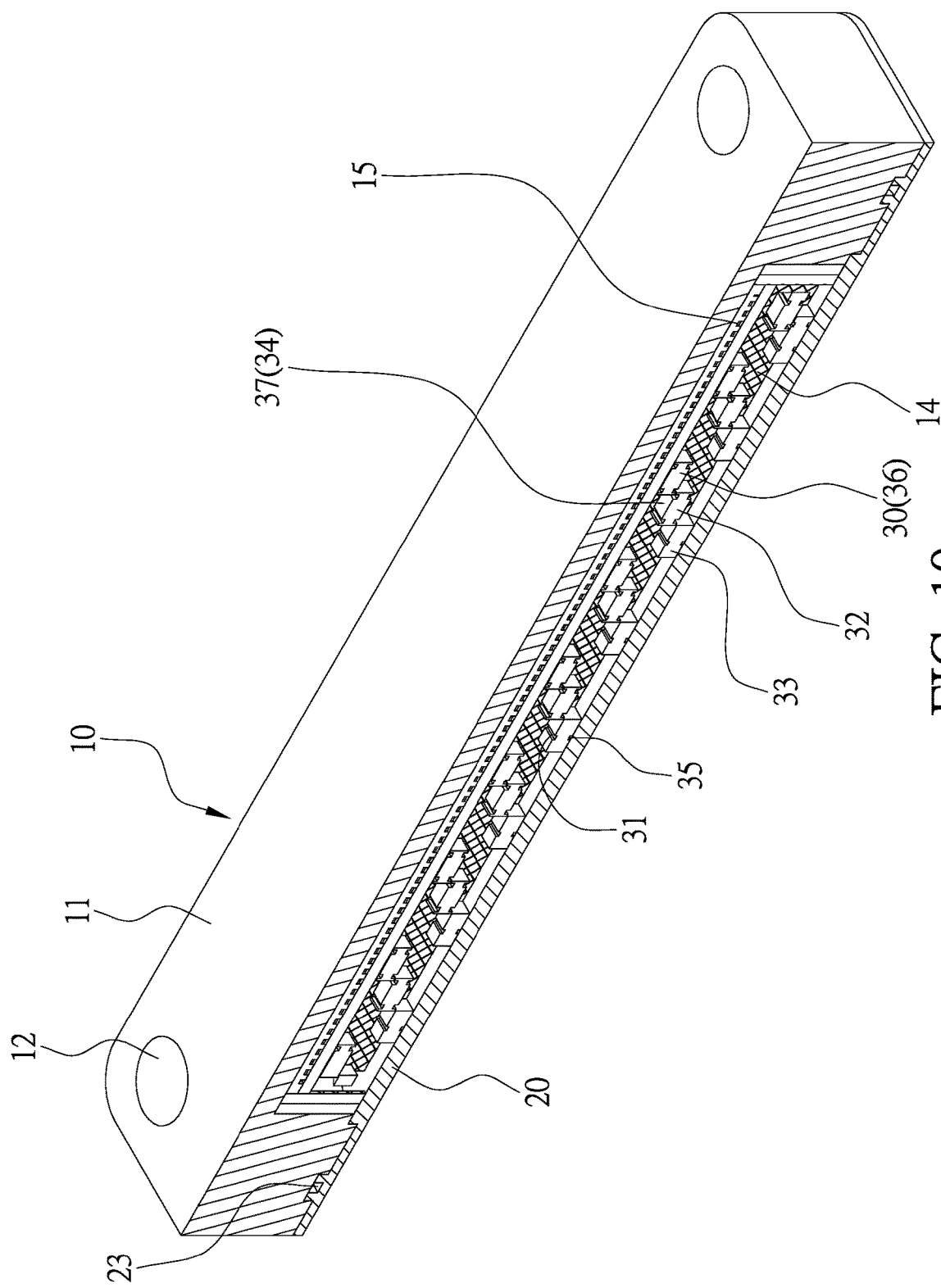
FIG. 10 is another cut-away view of the semiconductor chip shown in FIG. 4.

Referring to FIGS. 4 and 10, the cover 11 is attached to the plate 20. The cover 11 includes four vertical internal faces extending around a horizontal internal face so that there is an opening (not numbered) opposite to the horizontal internal face. The plate 20 closes the opening of the cover 11, thereby providing a closed vapor chamber 13. A sealing element 23 is provided between the plate 20 and the cover 11, thereby preventing the vapor chamber 13 from leakage.

Preferably, a capillary mechanism 15 is made on the internal faces of the cover 11. The capillary mechanism 15 includes five capillary units each of which is made in one of the internal faces of the cover 11. Each capillary unit includes multiple slits intersecting one another. The slits are made by etching, laser, pressing or casting.

Preferably, the cover 11 includes five nets 14. Each of the nets 14 is attached to one of the capillary units by soldering or adhesion. Each of the capillary units is located between one of the nets 14 and one of the internal faces of the cover 11. The nets 14 do not interfere with the capillary mechanism 15.

The semiconductor dice 44 are identical to one another in shape and size. However, the semiconductor dice 44 can be different from one another electrically.

The intermediate layers 30, 32 and 33 are different from one another in symbol. However, they are identical to one another mechanically. Preferably, the intermediate layers 30, 32 and 33 are made of ceramics such as aluminum nitride ceramics, aluminum oxide ceramics, silicon oxide ceramics and silicon nitride ceramics.

The intermediate layer 30 is sandwiched between the upper and middle semiconductor dice 44. The intermediate layer 32 is sandwiched between the middle and lower semiconductor dice 44. The intermediate layer 33 is located beneath the lower semiconductor die 44. The alternately arranged semiconductor dice 44 and intermediate layers 30, 32 and 33 are supported on the plate 20.

Preferably, each of the intermediate layers 30, 32 and 33 includes heat-transferring rods 43 arranged around a working region 40 that includes electrically conductive rods 42 arranged around a sitting region 41. The electrically conductive rods 42 are connected to an electronic circuit (not shown) embedded in the working region 40. Each of the electrically conductive rods 42 extends throughout the thickness of each of the intermediate layers 30, 32 and 33, and so does each of the heat-transferring rods 43.

For example, the electrically conductive rods 42 and the heat-transferring rods 43 can be made of copper that is excellent for electric conduction and heat transfer. However, the heat-transferring rods 43 are not used to conduct electricity, but only to transfer heat.

Each of the intermediate layers 30, 32 and 33 includes an upper capillary mechanism 31 made in an upper face of the sitting region 41 and a lower capillary mechanism 35 made in a lower face of the sitting region 41. Each of the upper and lower capillary mechanisms 31 and 35 includes intersecting slits made by etching, laser, pressing or casting.

Figure 13:
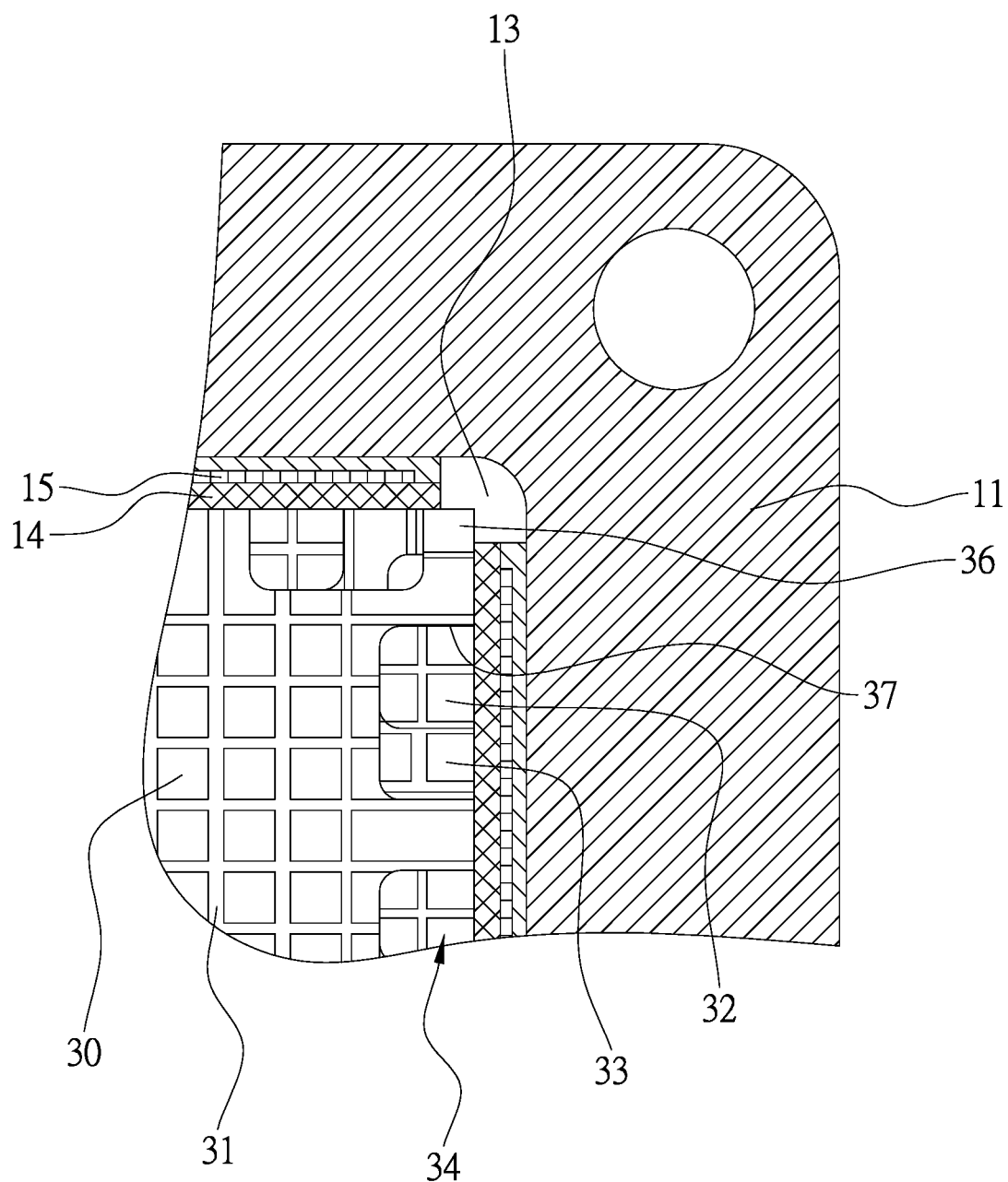
FIG. 13 is another cross-sectional view of the semiconductor chip shown in FIG. 9.

Each of the intermediate layers 30, 32 and 33 is preferably a square layer formed with four edges. Each of the intermediate layers 30, 32 and 33 includes four groups of protuberances 36 (FIG. 13). Each group of protuberances 36 is arranged along one of the edges. Any two adjacent ones of the protuberances 36 are separated from each other by a recess 37. That is, each of the intermediate layers 30, 32 and 33 includes alternately arranged protuberances 36 and recesses 37.

Figure 5:
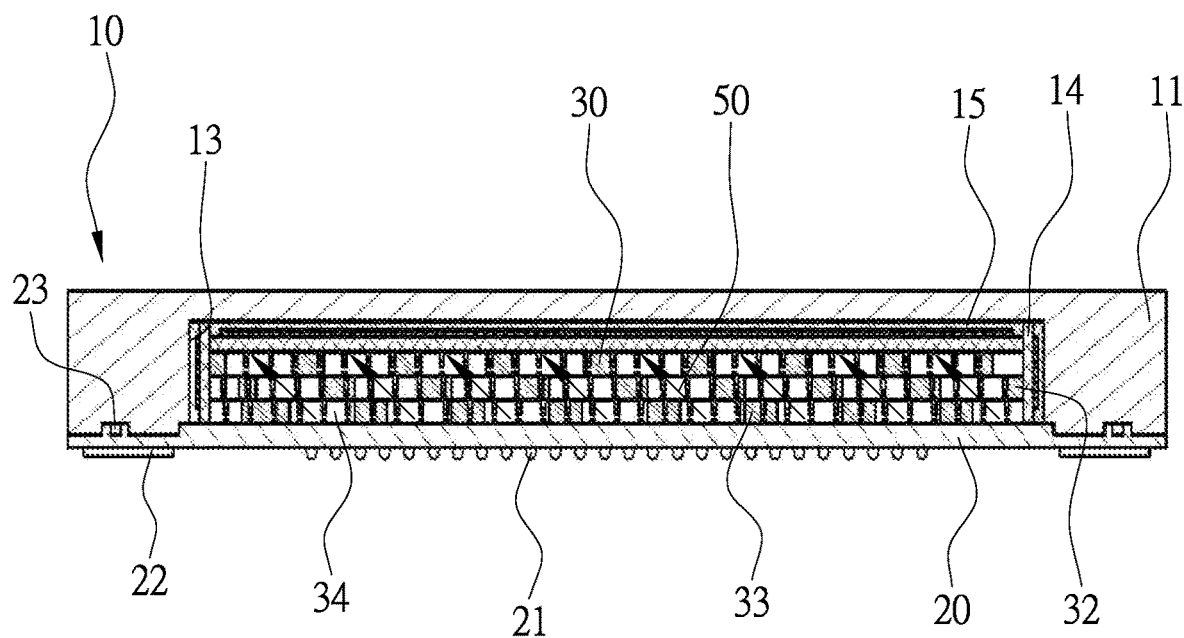
FIG. 5 is a cross-sectional perspective view of the semiconductor chip taken along a line A-A in FIG. 3.
Figure 6:
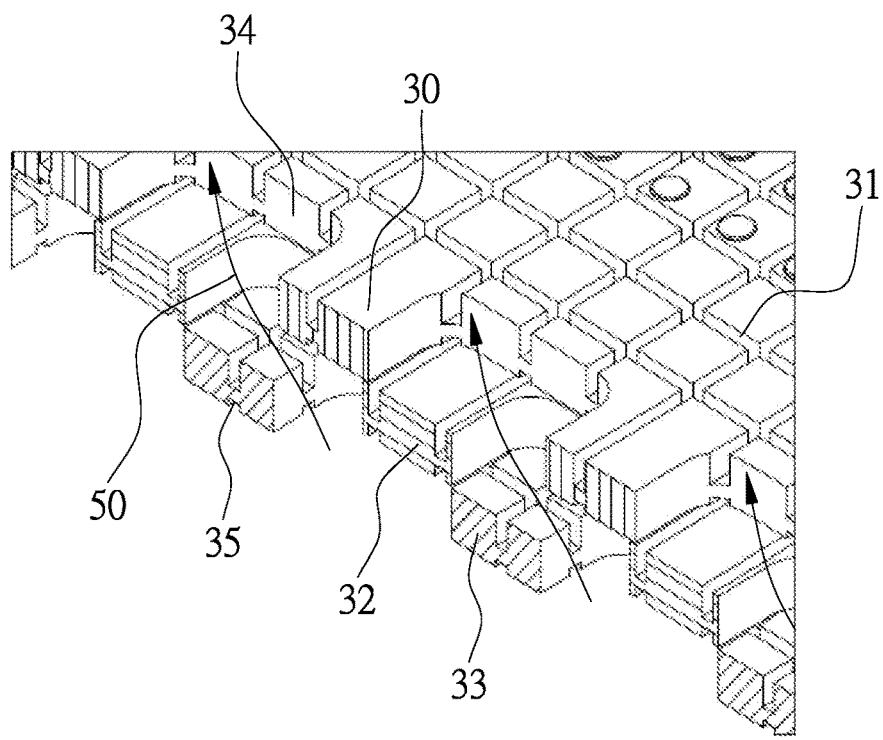
FIG. 6 is an enlarged partial view of the semiconductor chip shown in FIG. 4.
Figure 7:
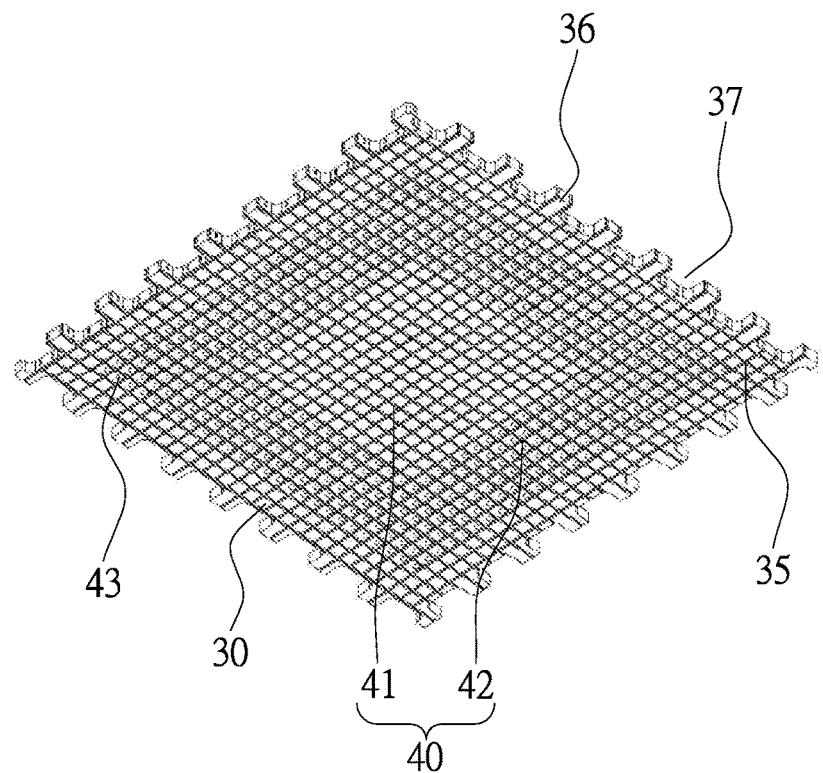
FIG. 7 is a perspective view of a bottom of an intermediate layer of the semiconductor chip shown in FIG. 4.

Referring to FIGS. 5, 6 and 10, the recesses 37 of the intermediate layer 32 are located below the protuberances 36 of the intermediate layer 30. The protuberances 36 of the intermediate layer 32 are located below the recesses 37 of the intermediate layer 30.

The recesses 37 of the intermediate layer 33 are located below the protuberances 36 of the intermediate layer 32. The protuberances 36 of the intermediate layer 33 are located below the recesses 37 of the intermediate layer 32.

When the cover 11 covers the semiconductor dice 44 and the intermediate layers 30, 32 and 33, the protuberances 36 are in contact with the nets 14. The recesses 37 between the protuberances 36 of the intermediate layers 30, 32 and 33 provide channels 34 that lead to vapor chamber 13 at an angle.

Figure 8:
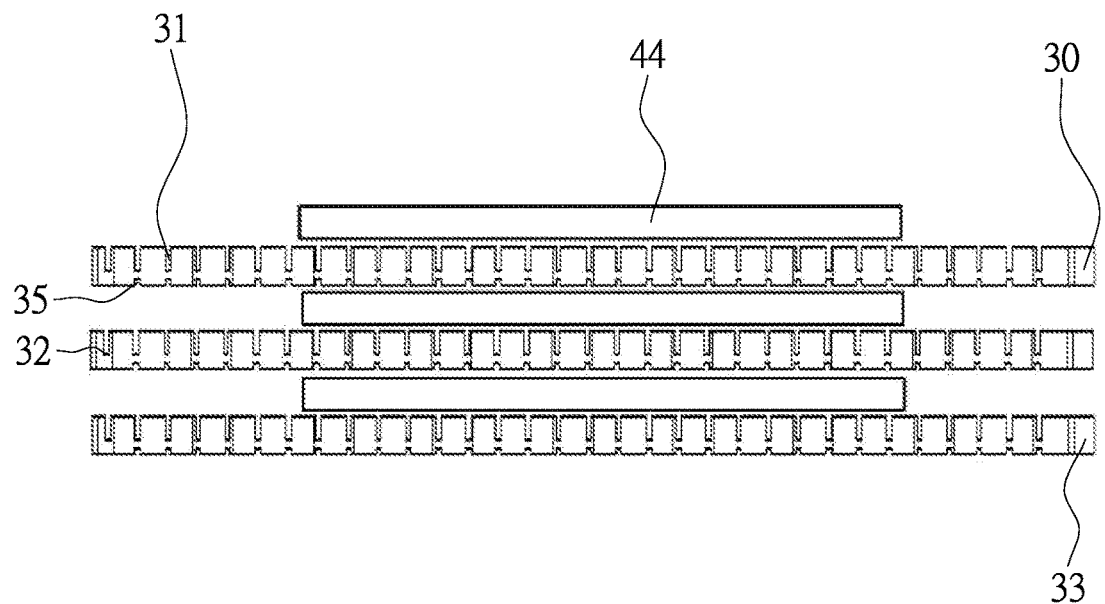
FIG. 8 is a side view of semiconductor dice alternately arranged with intermediate layers.
Figure 9:
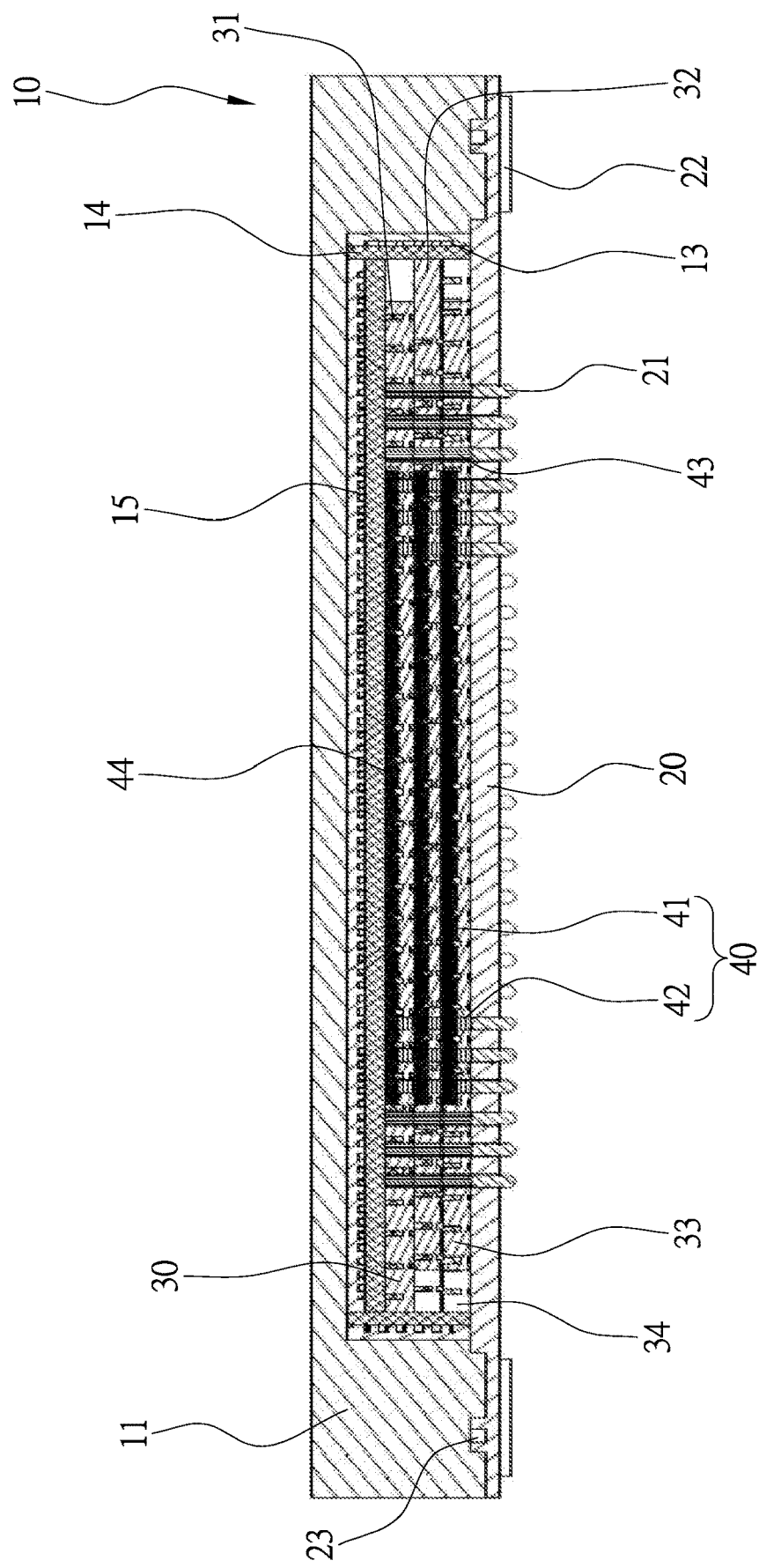
FIG. 9 is another cross-sectional view of the semiconductor chip shown in FIG. 5.

Referring to FIGS. 8 and 9, for briefness and clarity of the following description, the semiconductor dice 44 will be referred to as the upper semiconductor die 44, the middle semiconductor die 44 and the lower semiconductor die 44. The upper semiconductor die 44 is supported on the sitting region 41 of the intermediate layer 30. The middle semiconductor die 44 is sandwiched between the sitting region 41 of the intermediate layer 30 and the sitting region 41 of the intermediate layer 32. The lower semiconductor die 44 is sandwiched between the sitting region 41 of the intermediate layer 32 and the sitting region 41 of the intermediate layer 33.

Each of the electrically conductive rods 42 of the intermediate layer 30 is connected to one of the electrically conductive rods 42 of the intermediate layer 32 by soldering for example. Each of the electrically conductive rods 42 of the intermediate layer 32 is connected to one of the electrically conductive rods 42 of the intermediate layer 33 by soldering for example. Each of the electrically conductive rods 42 of the intermediate layer 33 is connected to one of the pins 21 of the plate 20 by soldering for example. The semiconductor dice 44 are electrically connected to one another via the electrically conductive rods 42 and electronic circuits of the intermediate layers 30, 32 and 33.

Each of the heat-transferring rods 43 of the intermediate layer 30 is connected to one of the heat-transferring rods 43 of the intermediate layer 32 by soldering for example. Each of the heat-transferring rods 43 of the intermediate layer 32 is connected to one of the heat-transferring rods 43 of the intermediate layer 33 by soldering for example. Each of the heat-transferring rods 43 of the intermediate layer 33 is connected to one of the pins 21 of the plate 20 by soldering for example. However, in another embodiment, each combination of one of the heat-transferring rods 43 of the intermediate layer 30 with one of the heat-transferring rods 43 of the intermediate layer 32 further with one of the heat-transferring rods 43 of the intermediate layer 33 can be replaced with a longer single heat-transferring rod extending throughout the intermediate layers 30, 32 and 33.

In operation, the semiconductor dice 44 produce heat. The intermediate layer 33 accumulate more heat than the intermediate layer 32 because the former is located below the latter. The intermediate layer 32 accumulate more heat than the intermediate layer 30 because the former is located below the latter.

Coolant (not shown) is filled in the vapor chamber 13 of the semiconductor chip 10. The coolant cools the semiconductor dice 44 in operation. Normally, the coolant is in the state of liquid. The coolant is turned into vapor after absorbing heat. The vapor goes to the cover 11. The coolant is returned into liquid after transferring heat to the cover 11. The liquid goes to the plate 20. Thus, the coolant is circulated in the vapor chamber 13. The amount of the coolant is constant and small because the coolant is kept in the vapor chamber 13, which is closed.

Preferably, the coolant is ultrapure water. However, in another embodiment the coolant can be alcohol, butane or any mixture of alcohol with butane.

In detail, part of the coolant absorbs part of the heat from the semiconductor dice 44. The remaining part of the heat is transferred to the intermediate layers 30, 32 and 33 and then absorbed by the remaining coolant. The coolant is transformed into vapor after absorbing the heat. The vapor travels to the internal faces of the cover 11. The channels 34 facilitate the travel of the vapor in a direction indicated by arrow heads 50 shown in FIG. 6. Then, the vapor transfers the heat to the cover 11 from which the heat is dissipated to the environment. After transferring the heat to the cover 11, the coolant is turned into liquid again. The nets 14 facilitate the condensation of the coolant. The liquid is transferred back to the semiconductor dice 44 and the intermediate layers 30, 32 and 33 via the capillary mechanisms 15.

Figure 11:
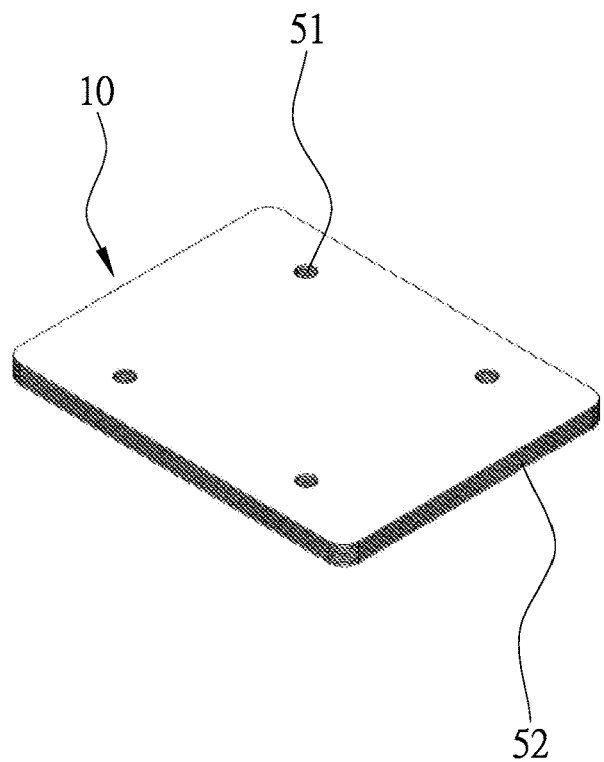
FIG. 11 is a perspective view of a top of a semiconductor chip according to the second embodiment of the present invention.
Figure 12:
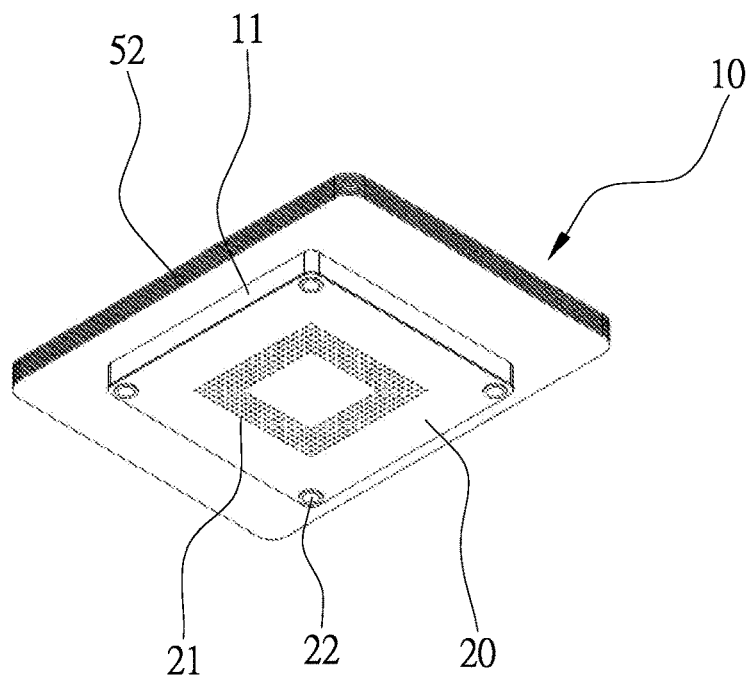
FIG. 12 is a perspective view of a bottom of the semiconductor chip of FIG. 11.

Referring to FIGS. 11 and 12, there is a semiconductor chip 10 according to a second embodiment of the present invention. The second embodiment is like the first embodiment except including a radiator 52 connected to the cover 11 by fasteners 51. In the second embodiment, the radiator 52 is in the form of a plate. However, in another embodiment, the radiator 52 can include multiple fins extending from an upper face.

The present invention has been described via the illustration of the embodiments. Those skilled in the art can derive variations from the embodiments without departing from the scope of the present invention. Therefore, the embodiments shall not limit the scope of the present invention defined in the claims.

The invention claimed is:

1. A semiconductor chip comprising:
   a plate;
   a cover comprises at least one capillary mechanism formed on an internal face and at least one net covering the capillary mechanism, wherein the cover is connected to the plate to provide a vapor chamber;
   multiple semiconductor dice inserted in the vapor chamber;
   multiple intermediate layers alternately arranged with the multiple semiconductor dice, wherein each of the intermediate layers comprises an upper capillary mechanism formed on an upper face, a lower capillary mechanism formed on a lower face, multiple protuberances extending from an edge, and multiple recesses alternately arranged with the protuberances, wherein the protuberances are in contact with the net, wherein the recesses of the intermediate layers are in communication with one another to provide channels in communication with the vapor chamber; and
   coolant filled in the vapor chamber, wherein the coolant is circulated in the vapor chamber by the capillary mechanism of the cover, the channels, and the upper and lower capillary mechanisms of the intermediate layers to transfer heat to the cover from the semiconductor dice.

2. The semiconductor chip according to claim 1, wherein the recesses of each of the intermediate layers are located above the protuberances of a lower one of the intermediate layers.

3. The semiconductor chip according to claim 1, wherein the cover is made of a material selected from the group consisting of copper and copper alloy.

4. The semiconductor chip according to claim 1, further the internal face of the cover is coated with a material selected from the group consisting of copper and copper alloy.

5. The semiconductor chip according to claim 1, wherein the capillary mechanism of the cover comprises intersecting slits made by a technique selected from the group consisting of etching, laser, pressing and casting.

6. The semiconductor chip according to claim 1, wherein the coolant comprises at least one material selected from the group consisting of water, alcohol, and butane.

7. The semiconductor chip according to claim 1, wherein the intermediate layers are made of a material selected from the group consisting of ceramics, aluminum nitride ceramics, aluminum oxide ceramics, silicon nitride ceramics and silicon oxide ceramics.

8. The semiconductor chip according to claim 1, comprising heat-transferring rods extending throughout the intermediate layers.

9. The semiconductor chip according to claim 1, comprising a radiator connected to an external face of the cover.

* * * * *